United States Patent

Kai et al.

[11] Patent Number: 6,162,730
[45] Date of Patent: *Dec. 19, 2000

[54] METHOD FOR FABRICATING SEMICONDUCTOR WAFERS

[75] Inventors: Fumitaka Kai; Masahiko Maeda; Jun-ichi Yamashita; Toshiharu Yubitani; Hirofumi Hajime; Takamitsu Harada, all of Miyazaki, Japan

[73] Assignee: Komatsu Electronic Metals Co., Ltd., Kanagawa, Japan

[*] Notice: This patent is subject to a terminal disclaimer.

[21] Appl. No.: 09/249,142

[22] Filed: Feb. 12, 1999

Related U.S. Application Data

[63] Continuation-in-part of application No. 08/705,155, Aug. 29, 1996, Pat. No. 5,899,743.

[30] Foreign Application Priority Data

Feb. 28, 1995 [JP] Japan ................................. 7-79266

[51] Int. Cl.[7] ..................... H01L 21/302; H01L 21/461
[52] U.S. Cl. .................. 438/690; 438/460; 438/753; 438/928; 438/974
[58] Field of Search ............................. 438/460, 690, 438/753, 928, 974

[56] References Cited

U.S. PATENT DOCUMENTS

| | | | |
|---|---|---|---|
| 4,144,099 | 3/1979 | Edmonds et al. | 438/471 |
| 5,374,842 | 12/1994 | Kusakabe | 438/476 |
| 5,494,862 | 2/1996 | Kato et al. | 438/753 |
| 5,582,536 | 12/1996 | Kagamida | 451/56 |

*Primary Examiner*—John F. Niebling
*Assistant Examiner*—David A. Zarneke
*Attorney, Agent, or Firm*—Varndell & Varndell, PLLC

[57] ABSTRACT

A method for efficiently fabricating semiconductor wafers of good planarization without utilizing chemical solutions of high etching rate is disclosed. The method slices a single-crystal ingot into slices of wafers. The edge of each wafer is chamfered. A lapping or grinding step is carried out to planarize the chamfered wafer. Both side surfaces of the wafer are then polished. Next, the wafer surface is mirror polished. Finally, the wafer is cleaned.

10 Claims, 7 Drawing Sheets

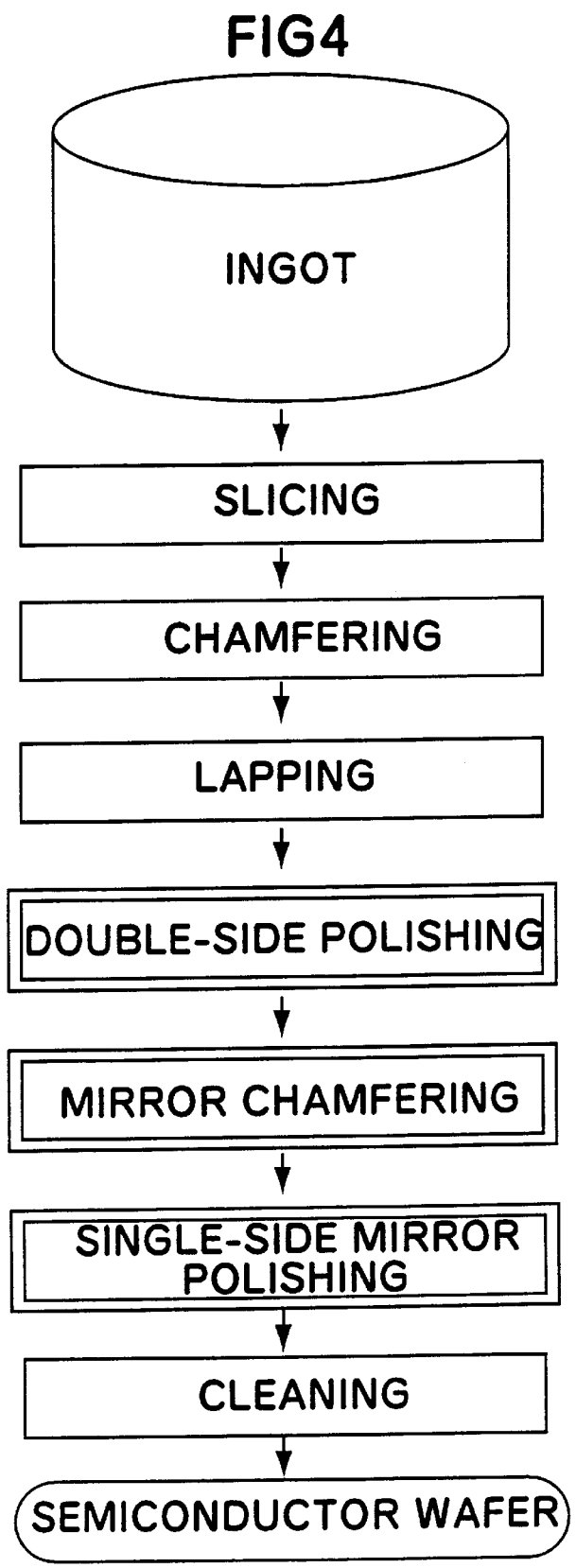

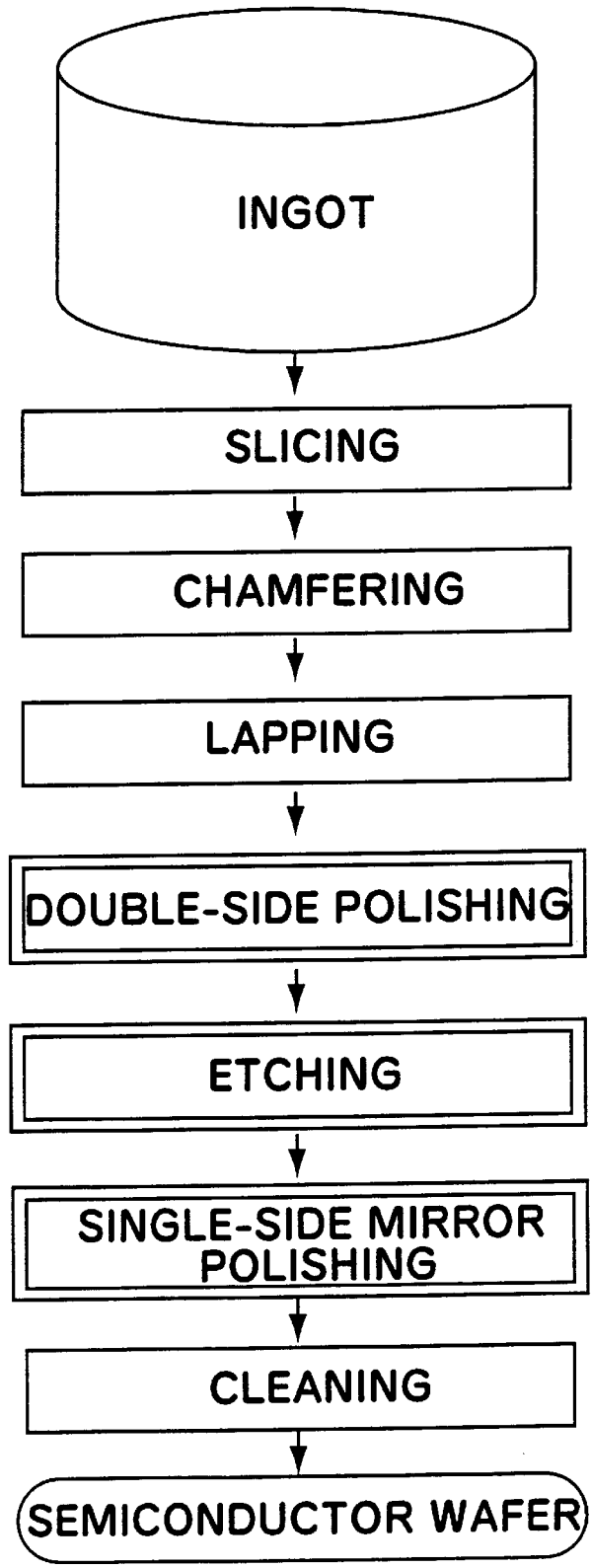

METHOD FOR FABRICATING SEMICONDUCTOR WAFERS

CROSS-REFERENCE TO RELATED APPLICATION

This application is a continuation-in-part application of Ser. No. 08/705,155 filed Aug. 29, 1996, now U.S. Pat. No. 5,899,743.

BACKGROUND OF THE INVENTION

1. Field of the Invention

The present invention relates to a method for fabricating a semiconductor wafer by mirror polishing its surfaces.

2. Description of the Related Art

A conventional method for fabricating a semiconductor wafer by mirror polishing the surface, as shown in FIG. 6, includes the following steps.

(1) Referring to FIG. 7A, a wafer is sliced from a single-crystal silicon ingot by an inner diameter saw slicing step.

(2) Referring to FIG. 7B, the rim of the silicon wafer is chamfered to prevent from cracking.

(3) Referring to FIG. 7C, the sliced surfaces of the chamfered wafer are lapped to attain a consistent thickness of the wafers.

(4) Deformation caused by the lapping process is removed by an etching process, as shown in FIG. 7D.

(5) Referring to FIG. 7E, the wafer is polished and mirror polished after the etching process.

(6) After the mirror polishing process, the wafer is cleaned with a chemical solution.

In order to increase the manufacturing efficiency, chemical solutions of high etching rates, such as mixed acid, are utilized in the aforementioned etching step.

However, the chemical solution etches the wafer so fast that the rim portion thereof tends to be over-etched. Referring to FIG. 7D, the center portion is therefore thicker than the rim portion of the wafer after the etching process. A wafer after the single-side polishing process still has a thickness difference of Δt due to the thickness variation in the fast etching process.

It is difficult to control the thickness difference Δt under 1 μm when etching solutions such as HF, $HNO_3$, $CH_3COOH$ and $H_2O$ are used.

Some methods, for example, that disclosed in Japanese Patent Publication No. 6-61681, entitled "Mirror Polishing Fabrication Method," have been provided to overcome the problem of thickness variation.

The mirror polishing fabrication method in which single or double sides of the wafer are polished has the single or double sides ground before a final polishing process.

However, the mirror polishing method introduces an additional single- or double-side polishing process into the conventional fabrication method thereby making the process more complicated.

Moreover, the grinding process on the wafer will result in processing deformation. In order to remove the deformation, other etching and polishing steps are required, thus further complicating the process.

SUMMARY OF THE INVENTION

Accordingly, the present invention provides an efficient method for fabricating semiconductor wafers of high planarization.

The method of the present invention slices a single-crystal ingot into slices of wafers. Each slice of wafer has its edge chamfered. The chamfered wafer is planarized by lapping. Both sides of the planarized wafer are polished. The wafer surface is then mirror polished and cleaned.

Moreover, the method of the present invention slices a single-crystal ingot into slices of wafers. Each slice of wafers has the edge chamfered. The chamfered wafer is planarized by lapping and/or grinding. Both sides of the planarized wafer are polished. The edge of the polished wafer is chamfered. The wafer surface is then mirror polished and cleaned.

Furthermore, the method of the present invention slices a single-crystal ingot into slices of wafer. Each slice of wafer has its edge chamfered. The chamfered wafer is planarized by lapping and/or grinding. Both sides of the planarized wafer are polished. The polished wafer is etched. The surface of the etched wafer is then processed and cleaned.

In the present invention, no etching process is required for the polished wafer since the process deformation can be removed by polishing both sides of the wafer. Moreover, the surface planarization can be improved at the same time. Therefore, semiconductor wafers of high planarization can be efficiently fabricated by the present invention, as compared with the prior art methods.

BRIEF DESCRIPTION OF THE DRAWINGS

FIG. 4 illustrates the process of the semiconductor wafer fabrication method in which a chamfering process is introduced;

FIG. 5 illustrates the process of the semiconductor wafer fabrication method in which an etching step is introduced;

DETAILED DESCRIPTION OF THE INVENTION

The embodiments of the present invention will now be described in accompaniment with the drawings.

Figure 1:
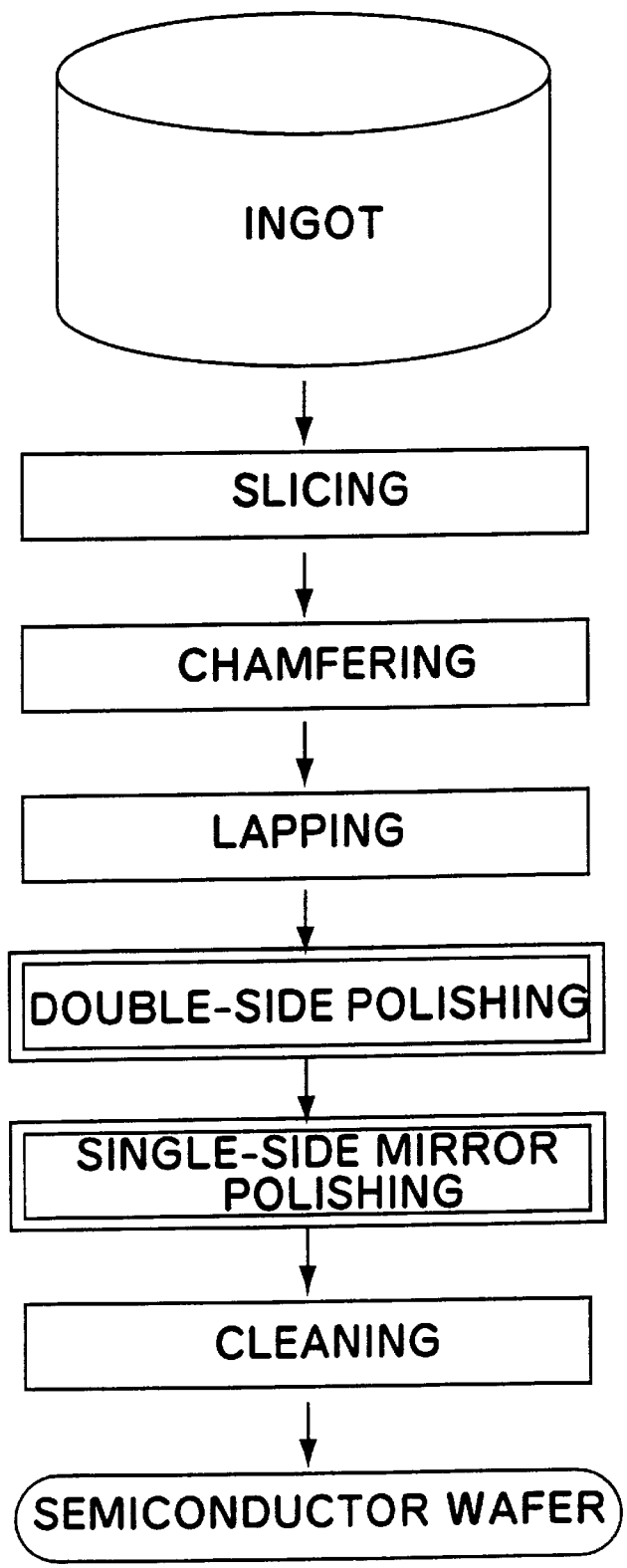
FIG. 1 illustrates the process of the semiconductor wafer fabrication of the present invention.

Referring to FIG. 1, in the process of the present embodiment, the steps from slicing the single-crystal ingot to the lapping step of a wafer are the same as those of a conventional process.

The double-side polishing step will be explained at first.

Figure 2:
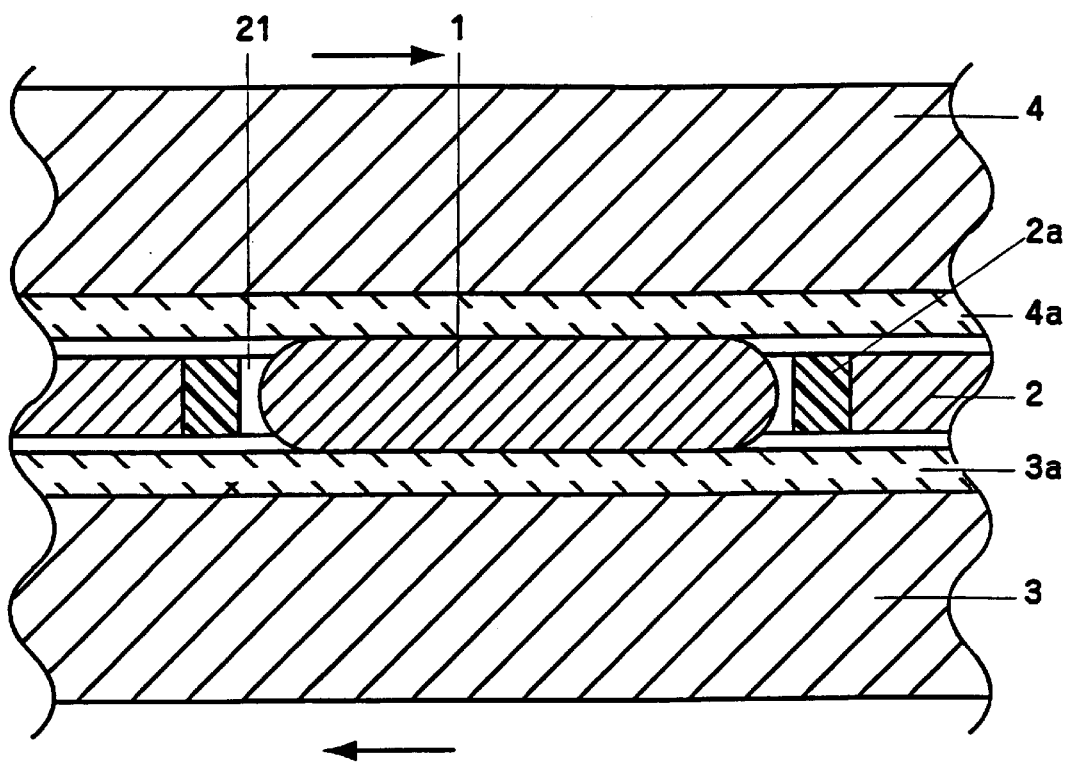
FIG. 2. Is a schematic diagram illustrating a double-side polishing process.

Referring to FIG. 2, a lapped wafer 1 is placed in a holding space 21 of a carrier 2. The wafer 1 is fixed therein by a lower lapping plate 3 over the surface of which is covered with a cloth 3a, and an upper lapping plate 4 under surface of which is covered with a cloth 4a. Similar to other lapping apparatus, the lower lapping plate 3 and the upper lapping plate 4 are driven by an internal gear (not shown in the figure) and a sun gear (also not shown in the figure) of different tooth numbers, thus rotating in opposite directions like a planetary motion and polishing both sides of the wafer 1. Moreover, resin cushion 2a can be formed on the wall of holding space 21 of the carrier 2 to prevent damage to the edges of the wafer 1.

Figure 3A:
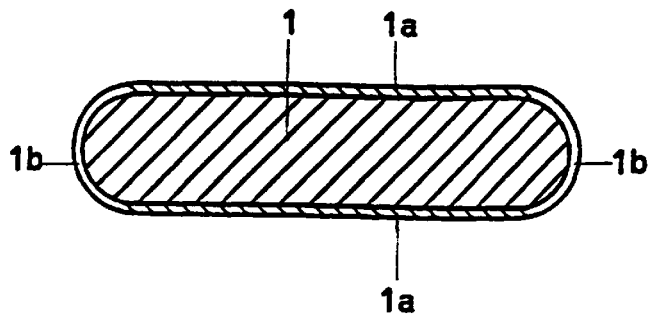
FIG. 3A through FIG. 3C are cross-sectional views of semiconductor wafers fabricated by the semiconductor fabrication apparatus and method of the present invention.

Referring to FIG. 3A, lapping deformation 1a exists on both side surfaces of the wafer 1.

Figure 3B:
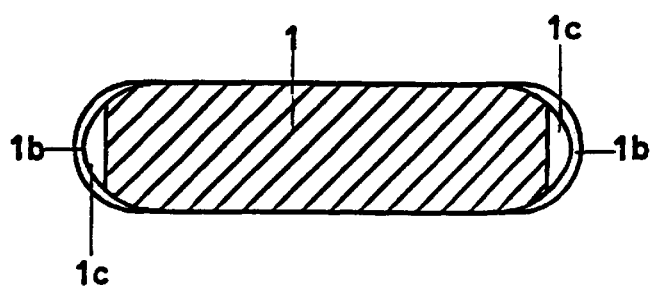

Referring to FIG. 3B, the lapping deformation 1a can be removed by a double-side polishing step. In order to achieve or maintain planarization, the double-side polishing step polishes about 5–50 μm deep on both sides of the wafer 1 for about 5–50 minutes. Since the double-side polishing step can achieve very good planarization, the thickness variation from the edge to the center is smaller than 0.1 μm.

In the present invention the step of lapping of the wafer as shown in FIG. 1 can be replaced by a step of grinding the chamfered wafer. The grinding can be carried out in a manner similar to that explained above for lapping, such as where the grinding of the both sides of the chamfered wafer is carried out simultaneously or the grinding is otherwise performed so that the wafers are planarized. Any grinding deformation that exists on both side surfaces of the wafers after the grinding step can be removed in the same manner as the lapping deformation discussed above. For example, the both surfaces of each of the wafers can be double-side polished so as to remove any grinding deformation formed by the grinding step while retaining a planarization of the semiconductor wafers.

Figure 7A:
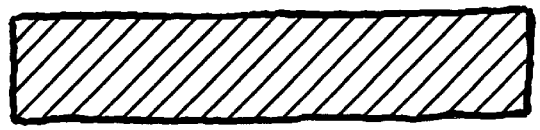
FIGS. 7A through 7E are cross-sectional views of semiconductor wafers fabricated by a conventional semiconductor wafer fabrication apparatus and method.
Figure 7B:
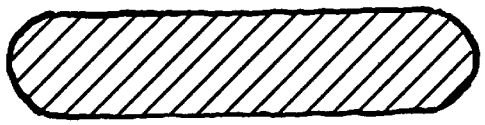
Figure 7C:
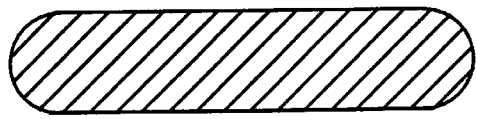
Figure 7D:
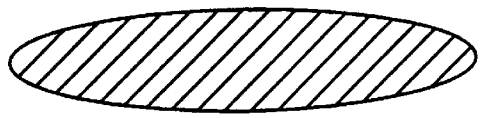
Figure 7E:
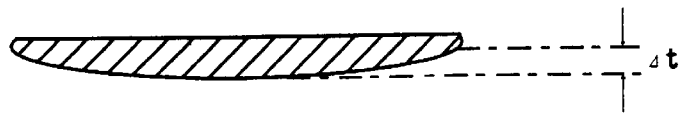

Referring to FIG. 1, a single-side polishing step on the wafer surface is carried out. The single-side polishing step is different to that of the prior art. Referring to FIG. 7D, since the conventional single-side polishing step is provided for planarizing the wafer surface and mirror polishing, a thickness of about 10–30 μm on the etched wafer has to be polished for about 20–40 minutes. In the present invention, however, the wafer after the double-side polishing step has been planarized. Therefore, in the finish single-side polishing step, only a mirror polishing step is required which polishes a thickness of about 0.01–1.0 μm for about 1–10 minutes.

Figure 3C:
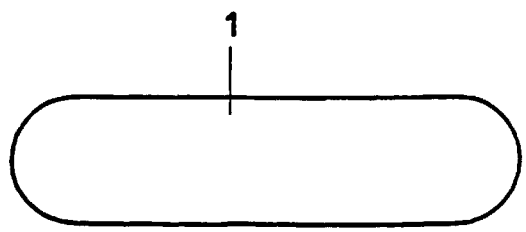
Figure 6:
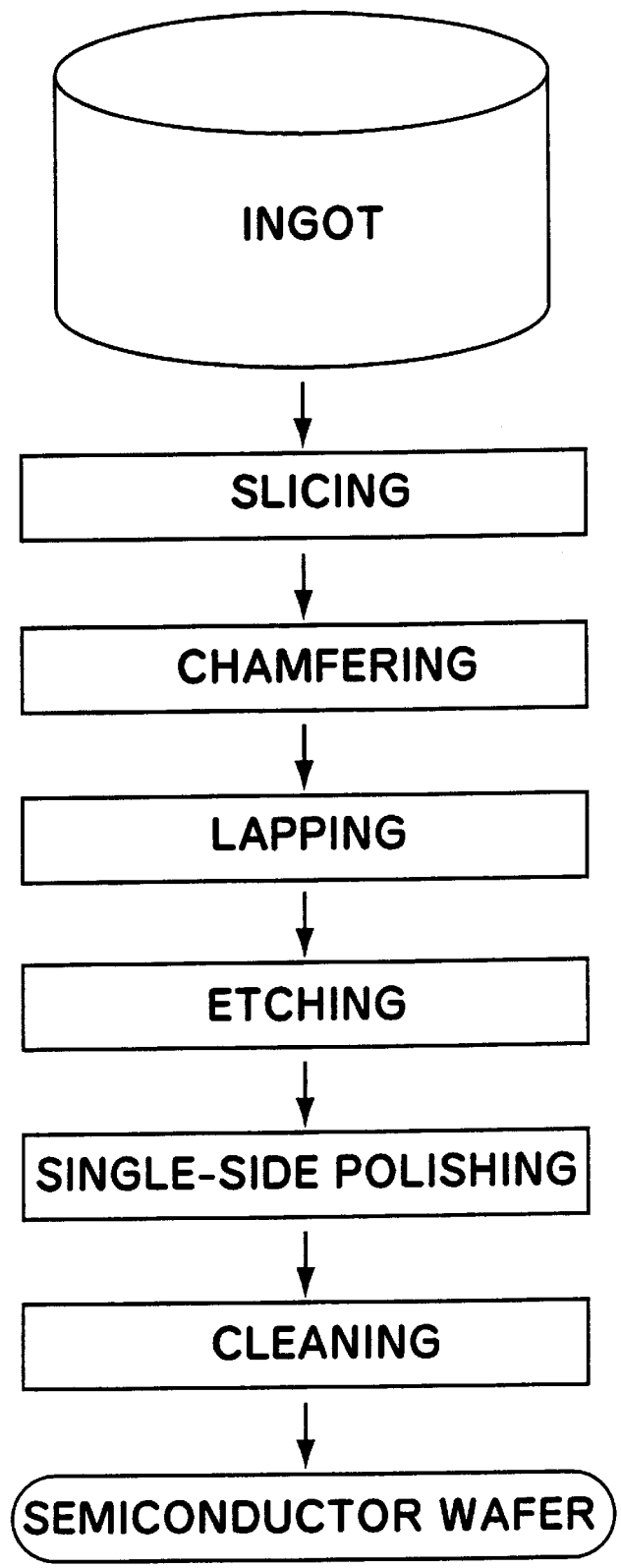
FIG. 6 illustrates the process of a conventional semiconductor wafer fabrication method.

Referring to FIG. 2, heavy metals and other particles over the wafer surface can be removed by chemical solutions. In the aforementioned embodiments, the lapping step causes lapping deformation on both side surfaces of the wafer, the grinding step causes deformation on both side surfaces of the wafer, and the chamfering step causes chamfering deformation. These deformations can be removed by the double-side polishing step, as shown in FIG. 3B. Referring to FIG. 2, superficial damage on edges of the wafer may occur when the wafer 1 comes into contact with the cushion 2a of the carrier 2. Since the wafer has very good planarization, the superficial damage does not affect the application of the wafer. However, in order to improve the quality and the yield, referring to FIG. 3C, methods such as mechanical mirror chamfering method, chemical etching method, or both can be utilized to remove the process deformation.

FIG. 4 illustrates the semiconductor wafer fabrication method in which a mirror chamfering step is utilized. The mirror chamfering method, referring to FIG. 4, utilizes apparatus such as a paper tape polishing apparatus to mirror chamfer the wafer which has been double-side polished. Next, the wafer is single-side polished, similar to the procedure of the aforementioned embodiment, and is then washed with chemical solutions.

FIG. 5 illustrates the semiconductor wafer fabrication method in which an etching step is utilized. The etching method, referring to FIG. 5, removes the edge process deformation of the double-side polishing step by etching. In addition to etching the wafers so as to remove a chamfering deformation formed by chamfering, the etching can also remove any edge process deformation formed by the double-side polishing from a face of a chamfered portion. Since chemical solutions of high etching rate are harmful to the planarization of the wafer, chemical solutions of lower etching rates, such as diluted KOH, NaOH, BHF and mixed acid of low concentration are recommended.

Similar to the procedure of the aforementioned embodiment, the wafer whose edge process deformation has been removed is then single-side polished and washed. Since the etching method can control the surface roughness of the wafer, a perfect wafer condition can be achieved if the etching method and the mirror chamfering method are both utilized.

The present invention therefore provides the following advantages.

1. The number of process steps is reduced as compared with the conventional technology, thus reducing the cost to efficiently fabricate semiconductor wafers of good planarization.
2. No chemical solution of high etching rate, such as mixed acid, is utilized, thus fabricating the wafers safely.
3. A mirror polishing step or the etching step can be utilized to fabricate semiconductor wafers of higher quality.

What is claimed is:

1. A method for fabricating semiconductor wafers comprising the steps of:
   (1) slicing a single-crystal ingot into wafers;
   (2) chamfering edges of each of the wafers;
   (3) lapping the sliced surfaces of each of the wafers so as to be planarized;
   (4) double-side polishing both surfaces of each of the wafers simultaneously so as to remove a lapping deformation formed by said lapping step while retaining a planarization of said semiconductor wafers;
   (5) single-side polishing one surface of each of the wafers for mirror polishing; and
   (6) cleaning the wafers.

2. The method for fabricating semiconductor wafers as claimed in claim 1, wherein said double-side polishing step is conducted after the lapping step without an etching process.

3. A method for fabricating semiconductor wafers comprising the steps of:
   (1) slicing a single-crystal ingot into wafers;
   (2) chamfering edges of each of the wafers;
   (3) lapping the sliced surfaces of each of the wafers so as to be planarized;
   (4) double-side polishing both surfaces of each of the wafers simultaneously so as to remove a lapping deformation formed by said lapping step while retaining a planarization of said semiconductor wafers;
   (5) etching the wafers;
   (6) single-side polishing one surface of each of the wafers for mirror polishing; and
   (7) cleaning the wafers.

4. The method for fabricating semiconductor wafers as claimed in claim 3, wherein said double-side polishing step is conducted after the lapping step without an etching step.

5. A method for fabricating semiconductor wafers comprising the steps of:

(1) slicing a single-crystal ingot into wafers;
(2) chamfering edges of each of the wafers;
(3) grinding the sliced surfaces of each of the wafers so as to be planarized;
(4) double-side polishing both surfaces of each of the wafers simultaneously so as to remove a grinding deformation formed by said grinding step while retaining a planarization of said semiconductor wafers;
(5) single-side polishing one surface of each of the wafers for mirror polishing; and
(6) cleaning the wafers.

6. The method for fabricating semiconductor wafers as claimed in claim 5, wherein said double-side polishing step is conducted after the grinding step without an etching process.

7. A method for fabricating semiconductor wafers comprising the steps of:
(1) slicing a single-crystal ingot into wafers;
(2) chamfering edges of each of the wafers;
(3) grinding the sliced surfaces of each of the wafers so as to be planarized;
(4) double-side polishing both surfaces of each of the wafers simultaneously so as to remove a grinding deformation formed by said grinding step while retaining a planarization of said semiconductor wafers;
(5) mirror polishing a face of a chamfered portion of each of the wafers for mirror polishing;
(6) single-side polishing one surface of each of the wafers for mirror polishing; and
(7) cleaning the wafers.

8. The method for fabricating semiconductor wafers as claimed in claim 7, wherein said double-side polishing step is conducted after the grinding step without an etching process.

9. A method for fabricating semiconductor wafers comprising the steps of:
(1) slicing a single-crystal ingot into wafers;
(2) chamfering edges of each of the wafers;
(3) grinding the sliced surfaces of each of the wafers so as to be planarized;
(4) double-side polishing both surfaces of each of the wafers simultaneously so as to remove a grinding deformation formed by said grinding step while retaining a planarization of said semiconductor wafers;
(5) etching the wafers so as to remove a chamfering deformation formed by chamfering and an edge process deformation formed by said double-side polishing from a face of a chamfered portion;
(6) single-side polishing one surface of each of the wafers for mirror polishing; and
(7) cleaning the wafers.

10. The method for fabricating semiconductor wafers as claimed in claim 9, wherein said double-side polishing step is conducted after the grinding step without an etching process.

* * * * *